(12) United States Patent
Chou et al.

(10) Patent No.: US 8,962,403 B2
(45) Date of Patent: Feb. 24, 2015

(54) MANUFACTURING METHOD FOR SWITCH AND ARRAY SUBSTRATE USING ETCHING SOLUTION COMPRISING AMINE

(71) Applicant: Shenzhen China Star Optoelectronics Technology Co., Ltd., Shenzhen, Guangdong (CN)

(72) Inventors: Yu-Lien Chou, Shenzhen (CN); Po-Lin Chen, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 128 days.

(21) Appl. No.: 13/701,863

(22) PCT Filed: Nov. 23, 2012

(86) PCT No.: PCT/CN2012/085150
§ 371 (c)(1),
(2) Date: Dec. 4, 2012

(87) PCT Pub. No.: WO2014/075333
PCT Pub. Date: May 22, 2014

(65) Prior Publication Data
US 2014/0141576 A1    May 22, 2014

(30) Foreign Application Priority Data
Nov. 19, 2012  (CN) .......................... 2012 1 0468449

(51) Int. Cl.
*H01L 21/00*    (2006.01)
*H01L 21/84*    (2006.01)
*H01L 21/302*   (2006.01)
*H01L 21/461*   (2006.01)
*H01L 29/45*    (2006.01)
*H01L 29/66*    (2006.01)

(52) U.S. Cl.
CPC ........ *H01L 29/458* (2013.01); *H01L 29/66765* (2013.01)
USPC ............................. 438/158; 438/159; 438/704

(58) Field of Classification Search
CPC .................................................. H01L 27/3248
See application file for complete search history.

(56) References Cited

U.S. PATENT DOCUMENTS

2010/0015805 A1* 1/2010 Mayer et al. .................. 438/692
2011/0233550 A1* 9/2011 Takasawa et al. ............... 257/57

* cited by examiner

*Primary Examiner* — Michael Jung
(74) *Attorney, Agent, or Firm* — Andrew C. Cheng

(57) ABSTRACT

The present invention discloses a manufacturing method for a switch and an array substrate. The method comprises: firstly, forming sequentially a first metal layer, an insulating layer, a semiconductor layer, an ohmic contact layer, a second metal layer, a third metal layer and a photoresist layer on a base substrate; after patterning the photoresist layer, etching the third metal layer and the second metal layer to form the input electrode and the output electrode of the switch; using a stripper comprising at least 30% by weight of amine in order to remove the photoresist layer and the residual second metal layer; and finally, etching the ohmic contact layer. Through the above steps, the present invention can avoid the electrical abnormality of the switch and increase process yield of the array substrate.

16 Claims, 3 Drawing Sheets

# MANUFACTURING METHOD FOR SWITCH AND ARRAY SUBSTRATE USING ETCHING SOLUTION COMPRISING AMINE

BACKGROUND OF THE INVENTION

1. Field of the Invention

The present invention relates to the field of liquid crystal device manufacturing techniques, especially relates to a manufacturing method for a switch and an array substrate.

2. Description of Related Art

Thin-film transistor (TFT) is one of the important elements of the array substrate and the thin film transistor technology is the core technology of the liquid crystal display, and it has a major impact on the quality of liquid crystal display.

In the manufacturing process of the thin film transistor, it generally goes through the cleaning, deposition, lithography, inspection and repair processes. The core process is photolithography mainly having photoresist coating, exposure, developing, etching, stripping, and other processes. When manufacturing metal traces of the thin film transistor on the base substrate, due to the resistivity of copper is smaller, it is more suitable for manufacturing the metal wire circuit for the large-size liquid crystal display device. Therefore, it generally uses copper for manufacturing the electrodes of the thin film transistor. However, copper is unfavorable for the photolithography process, and the adhesion force between the copper and the insulating layer containing silicon (Si) is relatively low. Therefore, in order to overcome the disadvantages of copper, before sputtering copper, it requires to add an adhesion layer containing molybdenum or titanium to increase the adhesion force between the copper layer and the insulating layer through molybdenum or titanium.

Specifically, as shown in FIG. 1, in step S1, firstly, after forming a gate electrode 11 of a thin film transistor on a glass base substrate 10, sequentially forming an insulating layer 12, a semiconductor layer 13, an ohmic contact layer 14, a molybdenum metal layer 15 above the gate electrode 11 and a copper metal layer 16 for forming a source electrode and a drain electrode of the thin film transistor, and then forming a photoresist layer 17 is on the copper metal layer 16. Then, it pattern the photoresist layer 17 to remove a portion of the photoresist layer 17 at a position 171 to expose a portion of the copper metal layer 16. In Step S2, etching the exposed copper metal layer 16 and the molybdenum metal layer 15 corresponding to and below the exposed copper metal layer 16 by utilizing an etching solution for copper. Thereby, it forms the source electrode and the drain electrode of the thin film transistor, and exposes a portion of the ohmic contact layer 14. In Step S3, it performs dry etching to the exposed ohmic contact layer 14 to realize the switching action of the thin film transistor. In Step S4, it uses the stripper to remove the photoresist layer 17.

In the above steps, on the one hand, due to the additional molybdenum metal layer 15, and on the other hand, it requires to etch the copper layer 16 and the molybdenum metal layer 15 using the etching solution for copper in the step S2. Therefore, when the etching selection ratio of copper to molybdenum is larger, it will cause that etching of the copper metal layer 16 has been finished to meet the requirements, but the etching of the molybdenum metal layer 15 is not completed. Therefore, it will result in the residue of the molybdenum metal. Although it can add the fluorine compound to the etching solution for effectively removing the molybdenum metal, the fluorine compound will also etch the glass base substrate 10, the insulating layer 12, the semiconductor layer 13 and the ohmic contact layer 14 such that the rework is impossible. Meanwhile, if the molybdenum metal cannot be removed, the residual molybdenum metal will impact the dry etching process of the ohmic contact layer 14 in step S3 such that the dry etching process cannot be performed smoothly, and the residual molybdenum metal will also lead to short circuit of the source electrode and the drain electrode, resulting in electrical abnormality of the thin film transistor.

SUMMARY OF THE INVENTION

The technical problem solved by the embodiment of the present invention is to solve is to provide a manufacturing method for a switch and an array substrate to avoid the electrical abnormality of the switch and increase process yield of the array substrate.

In order to solve the above-mentioned technical problem, a technical solution provided by the present invention is: a method for manufacturing a switch of an array substrate, comprising:

forming sequentially a first metal layer, an insulating layer, a semiconductor layer, an ohmic contact layer, a second metal layer, a third metal layer and a photoresist layer on a base substrate, wherein, the first metal layer uses for forming a control electrode of a switch, and the third metal layer uses for forming an input electrode and an output electrode of the switch;

patterning the photoresist layer to expose a portion of the third metal layer:

etching to remove the exposed portion of the third metal layer and the second metal layer corresponding to and below the exposed portion of the third metal layer to form the input electrode and the output electrode of the switch, and to expose a portion of the ohmic contact layer;

making the base substrate contact with a stripper comprising at least 30% by weight of amine in order to remove the photoresist layer and the residual second metal layer corresponding to and below the exposed portion of the third metal layer; and etching the exposed portion of the ohmic contact layer;

wherein, the second metal layer comprises molybdenum metal or titanium metal, and its thickness ranges from 150 A to 300 A, and the third metal layer comprises copper, and its thickness ranges from 1500 A to 5000 A; and the stripper comprises at least one of an ammonia, an alcohol, an ester compound and a corrosion inhibitor.

wherein, in the step of etching to remove the exposed portion of the third metal layer and the second metal layer corresponding to and below the exposed portion of the third metal layer comprises: using wet etching method to etch the exposed portion of the third metal layer and the second metal layer corresponding to and below the exposed portion of the third metal layer.

Wherein, in the step of etching the exposed portion of the ohmic contact layer comprises: using dry etching method to etch the exposed portion of the ohmic contact layer.

wherein, in the step of forming sequentially a first metal layer, an insulating layer, a semiconductor layer, an ohmic contact layer, a second metal layer, a third metal layer and a photoresist layer on a base substrate comprises: forming the first metal layer on the base substrate, performing etching to the first metal layer to form the control electrode of the switch; after etching the first metal layer, forming the insulating layer on the first metal; sequentially forming the semiconductor layer and the ohmic contact layer, and patterning the semiconductor layer and the ohmic contact layer; and sequentially forming the second metal layer, the third metal layer and the photoresist layer on the ohmic contact layer.\n Wherein, the switch is a thin film transistor, and the first metal layer is used for forming a gate electrode as the control electrode of the thin film transistor, and the third metal layer is used for forming a source electrode as the input electrode of the thin film transistor and a drain as the output electrode.

In order to solve the above-mentioned technical problem, another technical solution provided by the present invention is: a method for manufacturing a switch of an array substrate, comprising:

forming sequentially a first metal layer, an insulating layer, a semiconductor layer, an ohmic contact layer, a second metal layer, a third metal layer and a photoresist layer on a base substrate, wherein, the first metal layer uses for forming a control electrode of a switch, and the third metal layer uses for forming an input electrode and an output electrode of the switch;

patterning the photoresist layer to expose a portion of the third metal layer;

etching to remove the exposed portion of the third metal layer and the second metal layer corresponding to and below the exposed portion of the third metal layer to form the input electrode and the output electrode of the switch, and to expose a portion of the ohmic contact layer;

making the base substrate contact with a stripper comprising at least 30% by weight of amine in order to remove the photoresist layer and the residual second metal layer corresponding to and below the exposed portion of the third metal layer; and etching the exposed portion of the ohmic contact layer.

Wherein, the second metal layer comprises molybdenum metal or titanium metal, and its thickness ranges from 150 A to 300 A, and the third metal layer comprises copper, and its thickness ranges from 1500 A to 5000 A.

Wherein, the stripper comprises at least one of ammonia, an alcohol, an ester compound and a corrosion inhibitor.

wherein, in the step of etching to remove the exposed portion of the third metal layer and the second metal layer corresponding to and below the exposed portion of the third metal layer comprises: using wet etching method to etch the exposed portion of the third metal layer and the second metal layer corresponding to and below the exposed portion of the third metal layer.

Wherein, in the step of etching the exposed portion of the ohmic contact layer comprises: using dry etching method to etch the exposed portion of the ohmic contact layer.

wherein, in the step of forming sequentially a first metal layer, an insulating layer, a semiconductor layer, an ohmic contact layer, a second metal layer, a third metal layer and a photoresist layer on a base substrate comprises: forming the first metal layer on the base substrate, performing etching to the first metal layer to form the control electrode of the switch; after etching the first metal layer, forming the insulating layer on the first metal; sequentially forming the semiconductor layer and the ohmic contact layer, and patterning the semiconductor layer and the ohmic contact layer; and sequentially forming the second metal layer, the third metal layer and the photoresist layer on the ohmic contact layer.

Wherein, the switch is a thin film transistor, and the first metal layer is used for forming a gate electrode as the control electrode of the thin film transistor, and the third metal layer is used for forming a source electrode as the input electrode of the thin film transistor and a drain as the output electrode.

In order to solve the above-mentioned technical problem, another technical solution provided by the present invention is: a manufacturing method for an array substrate comprising a manufacturing method for a switch, the method comprising:

forming sequentially a first metal layer, an insulating layer, a semiconductor layer, an ohmic contact layer, a second metal layer, a third metal layer and a photoresist layer on a base substrate, wherein, the first metal layer uses for forming a control electrode of a switch, and the third metal layer uses for forming an input electrode and an output electrode of the switch;

patterning the photoresist layer to expose a portion of the third metal layer;

etching to remove the exposed portion of the third metal layer and the second metal layer corresponding to and below the exposed portion of the third metal layer to form the input electrode and the output electrode of the switch, and to expose a portion of the ohmic contact layer;

making the base substrate contact with a stripper comprising at least 30% by weight of amine in order to remove the photoresist layer and the residual second metal layer corresponding to and below the exposed portion of the third metal layer; and etching the exposed portion of the ohmic contact layer.

Wherein, the second metal layer comprises molybdenum metal or titanium metal, and its thickness ranges from 150 A to 300 A, and the third metal layer comprises copper, and its thickness ranges from 1500 A to 5000 A.

Wherein, the stripper comprises at least one of ammonia, an alcohol, an ester compound and a corrosion inhibitor.

wherein, in the step of etching to remove the exposed portion of the third metal layer and the second metal layer corresponding to and below the exposed portion of the third metal layer comprises: using wet etching method to etch the exposed portion of the third metal layer and the second metal layer corresponding to and below the exposed portion of the third metal layer.

Wherein, in the step of etching the exposed portion of the ohmic contact layer comprises: using dry etching method to etch the exposed portion of the ohmic contact layer.

wherein, in the step of forming sequentially a first metal layer, an insulating layer, a semiconductor layer, an ohmic contact layer, a second metal layer, a third metal layer and a photoresist layer on a base substrate comprises: forming the first metal layer on the base substrate, performing etching to the first metal layer to form the control electrode of the switch; after etching the first metal layer, forming the insulating layer on the first metal; sequentially forming the semiconductor layer and the ohmic contact layer, and patterning the semiconductor layer and the ohmic contact layer; and sequentially forming the second metal layer, the third metal layer and the photoresist layer on the ohmic contact layer.

Wherein, the switch is a thin film transistor, and the first metal layer is used for forming a gate electrode as the control electrode of the thin film transistor, and the third metal layer is used for forming a source electrode as the input electrode of the thin film transistor and a drain as the output electrode.

The beneficial effect of the present invention is: the third metal layer uses for forming the input electrode and the output electrode of the switch, after etching to remove the exposed third metal layer and the second metal layer corresponding to and below the exposed third metal layer, using a stripper containing at least 30% by weight of amine in order to remove the photoresist layer and the residual second metal layer. Finally, it etches the exposed portion of the ohmic contact layer. Therefore, when etching the exposed ohmic contact layer, the residual second metal layer has been removed in order to ensure that the etching process of the ohmic contact layer to perform smoothly and also to prevent the residue metal from causing the short circuit of the input electrode and the output electrode of the switch. It effectively avoids the electrical abnormality of the switch and increase process yield of the array substrate. And it uses the stripper comprising at least 30% by weight of amine to remove the residual second metal layer. It is able to effectively remove the residual metal, and it does not corrode the base substrate, which is conducive to the rework process.

DETAILED DESCRIPTION OF THE PREFERRED EMBODIMENT

The following content combines with the drawings and the embodiment for describing the present invention in detail.

Figure 1:
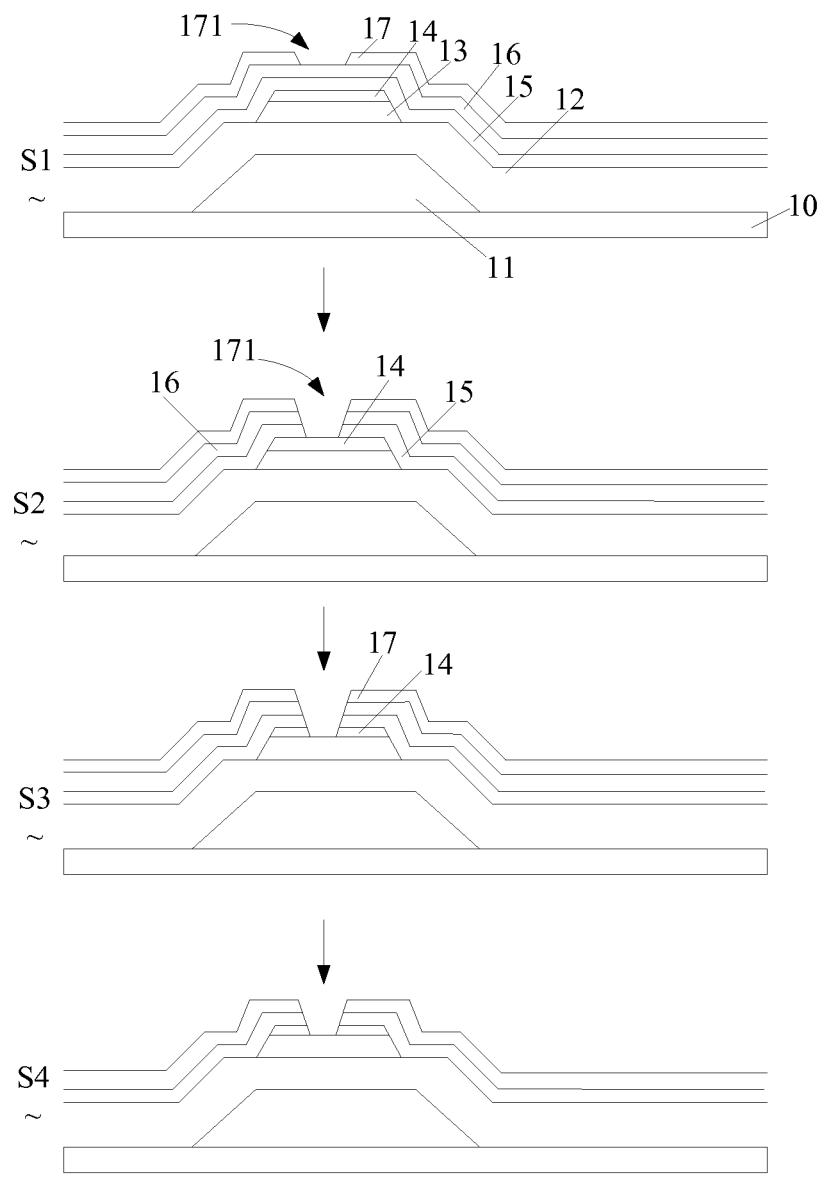
FIG. 1 is a schematic diagram of the manufacturing process of the thin film transistor of the array substrate in prior art.
Figure 2:
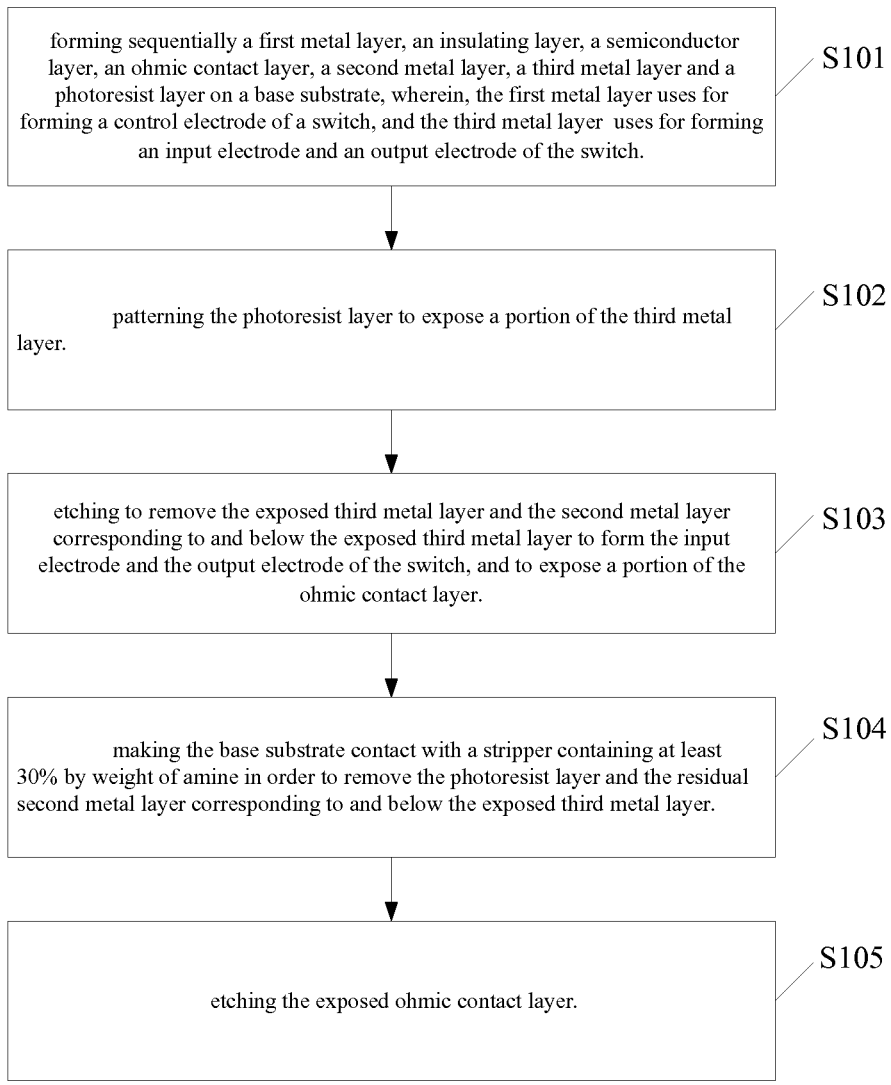
FIG. 2 is a flowchart of an embodiment of the manufacturing method of the switch of the array substrate according to the present invention.

With reference to FIG. 2, it is a flowchart of an embodiment of the manufacturing method of the switch of the array substrate according to the present invention, and comprises steps of:

Step S101: forming sequentially a first metal layer 111, an insulating layer 112, a semiconductor layer 113, an ohmic contact layer 114, a second metal layer 115, a third metal layer 116 and a photoresist layer 117 on a base substrate 100, wherein, the first metal layer 111 uses for forming a control electrode of a switch, and the third metal layer 116 uses for forming an input electrode and an output electrode of the switch.

Figure 3:
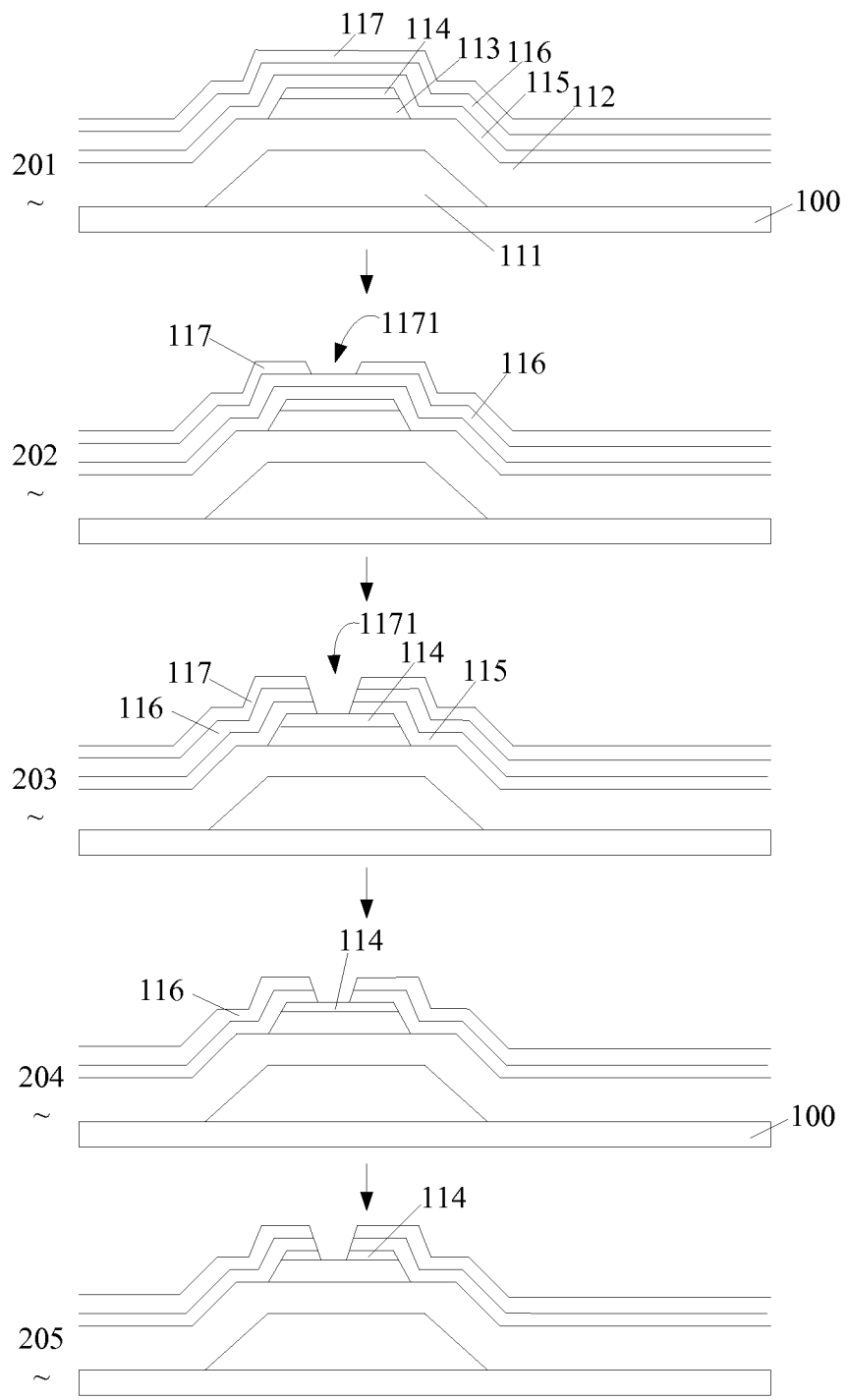
FIG. 3 is a schematic diagram of an embodiment of the manufacturing method of the switch of the array substrate according to the present invention.

The switch is a three-terminal control switch. For illustrating the manufacturing process of the switch of the present invention, combined with the manufacturing process schematically shown in FIG. 3. As shown in FIG. 3, in sub-step 201, after cleaning and drying the base substrate 100, sputtering the first metal layer 111 for forming the control electrode of the switch, and then etching the first metal layer 111 to make the first metal layer 111 form a gate electrode pattern. Thereby, it completes the forming of the electrode of the switch. Wherein, in the process of etching the first metal layer 111, it includes step of coating a photoresist, exposure, etching, stripping the photoresist, and other processes applying to the first metal layer 111.

After the completion of the control electrode of the switch, sequentially forming the insulating layer 112, the semiconductor layer 113 and the ohmic contact layer 114 on the first metal layer 111. And it patterns the semiconductor layer 113 and the ohmic contact layer 114. Thereafter, sequentially forming the second metal layer 115 and the third metal layer 116 on the ohmic contact layer 114 and on the insulating layer 112 not covered by the ohmic contact layer 114. Wherein, the third metal layer 116 uses for forming the input electrode and the output electrode of the switch, and it is a copper-containing metal layer with a thickness ranging from 1500 A to 5000 A. The second metal layer 115 is the metal layer containing molybdenum metal, and its thickness ranges from 150 A to 300 A for increasing the adhesion force between the third metal layer 116 and the insulating layer 112 to improve the quality of the switch.

For forming circuit pattern of the input and output electrodes of switch on the third metal layer 116, before etching the third metal layer 116 to form the input and output electrodes, forming the photoresist layer 117 on the third metal layer 116. The photoresist layer 117 may be made of a photoresist which is photosensitive to ultraviolet (Ultraviolet, UV).

The process of forming of the input electrode and the output electrode of the switch is specifically:

Step S102: patterning the photoresist layer 117 to expose a portion of the third metal layer 116.

With reference to FIG. 3, in sub-step 202 of FIG. 3, when the photoresist layer 117 is a photoresist, using ultraviolet light to pass through a mask having pattern of the input electrode and the output electrode to irradiate the photoresist layer 117 such that the photoresist layer 117 will occur the molecular cleavage or polarity change. And then using the developer to remove the portion of photoresist layer 117 irradiated by ultraviolet light such that a gap 1171 shown in FIG. 3 is formed. Thereby, it forms the patterned photoresist layer 117 to expose the portion of the third metal layer 116.

Step S103: etching to remove the exposed third metal layer 116 and the second metal layer 115 corresponding to and below the exposed third metal layer 116 to form the input electrode and the output electrode of the switch, and to expose a portion of the ohmic contact layer 114.

Corresponding to sub-step 203 in FIG. 3, it etches the third metal layer 116 and removing the exposed third metal layer 116, and forming a pattern of the photoresist layer 117 on the third metal layer 116 which is not removed because of covering by the photoresist layer 117. Wherein, the etching method comprises two ways of wet etching and dry etching. The wet etching method uses an etching solution for processing to remove unwanted metal, and the dry etching method uses the chemically active group and ion generated from chemical reactive gas to bombard the material to be etched, after the energetic ions accelerated by the electric field. In the present embodiment, it uses wet etching method to etch the third metal layer 116. After etching the third metal layer 116, the etching solution continues to etch the second metal layer 115 exposed below the third metal layer 116 to remove a portion of the second metal layer 115 so that a portion of the ohmic contact layer 114 is exposed.

After the completion of the etching step, the third metal layer 116 are not removed because of covering with the resist layer 117 has the pattern of the photoresist layer 117 and the pattern of the photoresist layer 117 corresponds to the pattern of the input and the output electrodes of the switch. Therefore, the unremoved portion of the third metal layer 1164 forms the input electrodes and the output electrodes of the switch, and the input and output electrodes are not electrically connected by a notch 1171 as a boundary.

Step S104: making the base substrate 100 contact with a stripper containing at least 30% by weight of amine in order to remove the photoresist layer 117 and the residual second metal layer 115 corresponding to and below the exposed third metal layer 116.

This step corresponds to the sub-step 204 in FIG. 3. In the present embodiment, it uses a wet stripping process to remove the photoresist layer 117, i.e. with a stripper to remove the photoresist layer 117 for forming the pattern. The stripper contains at least 30% by weight of the amine, which can range from 30% by weight to 70% by weight. In particularly, it can depend on actual situation to choose and it will not limit here. The content of amine of the stripper is greater than or equal to 30% by weight, so that when the stripper is used to remove the photoresist layer 117, it can also efficiently remove the molybdenum metal residual in step S103. The stripper can also contain ammonia, an alcohol, an ester compound and/or corrosion inhibitors.

Step S105: etching the exposed ohmic contact layer 114.

In the step S103, after etching the second metal layer 115 and the third metal layer 116, it exposes a portion of the ohmic contact layer 114. In order to achieve the switching function of the switch, it etches the exposed ohmic contact layer 114. As shown in sub-step 205 of FIG. 3. In the present embodiment, it uses dry etching method to etch the exposed ohmic contact layer 114.

In the present embodiment, the switch is a thin film transistor. The control electrode of the switch corresponds to the gate electrode of the thin film transistor, and the input and the output electrodes of the switch respectively corresponds to the source and drain electrodes of the thin film transistor. In the above steps, the first metal layer 111 is used for forming the gate electrode as the control electrode of the thin film transistor, and the third metal layer 116 is used for forming the source electrode as the input electrode of the thin film transistor and the drain as the output electrode.

In summary, in the present embodiment, the stripper for removing the photoresist layer 117 contains at least 30% by weight of amine. It is able to effectively remove the residual photoresist layer 117, while removing the molybdenum metal and it does not corrode the base substrate 100, which is conducive to the rework process. Furthermore, in the present embodiment, after etching the second metal layer 115 and the third metal layer 116, it performs the step of removing the photoresist layer 117 immediately. Until the residual metal is removed, it performs the step of etching the exposed ohmic contact layer 114 so that when etching the exposed ohmic contact layer 114, the ohmic contact layer 114 does not have residual metal. It can ensure that the etching process of the ohmic contact layer 114 to perform smoothly and also to prevent the residue metal from causing the short circuit of the input electrode and the output electrode of the switch. Therefore, it effectively avoids the electrical abnormality of the switch and increase process yield of the array substrate.

In the above-described embodiment, the second metal layer 115 is the metal layer containing molybdenum metal. In another embodiment, the second metal layer 115 can also be the metal layer containing titanium metal. The stripper for removing the photoresist layer contains at least 30% by weight of amine. When removing the photoresist layer, the stripper can also effectively removes the residual titanium metal in order to increase the process yield of the array substrate, the specific removal process can be referred to the above embodiment, and it will not repeat again.

The present invention also provides a method for manufacturing an array substrate. It includes the manufacturing method of the switch of the above embodiment. In addition, after completion of the manufacturing of the switch, it forms a protective layer on the switch in order to protect the control electrode of the switch, the input electrode and the output electrode. Patterning the protective layer to expose some portions of the control electrode, the input electrode and the output electrode such that after formation of patterned pixel electrodes, the pixel electrodes can electrically connect to the output electrode of the switch, and the exposed portions of the control electrode and the input electrode can also electrically connect to the corresponding elements of the array substrate.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A method for manufacturing a switch of an array substrate, comprising:
    forming sequentially a first metal layer, an insulating layer, a semiconductor layer, an ohmic contact layer, a second metal layer, a third metal layer and a photoresist layer on a base substrate, wherein, the first metal layer uses for forming a control electrode of a switch, and the third metal layer uses for forming an input electrode and an output electrode of the switch;
    patterning the photoresist layer to expose a portion of the third metal layer;
    etching to remove the exposed portion of the third metal layer and the second metal layer corresponding to and below the exposed portion of the third metal layer to form the input electrode and the output electrode of the switch, and to expose a portion of the ohmic contact layer;
    making a contact to the base substrate with a stripper comprising at least 30% by weight of amine to remove the photoresist layer and a residual second metal layer corresponding to and below the exposed portion of the third metal layer; and
    etching the exposed portion of the ohmic contact layer;
    wherein, the second metal layer comprises molybdenum metal or titanium metal, and its thickness ranges from 150 A to 300 A, and the third metal layer comprises copper, and its thickness ranges from 1500 A to 5000 A; and the stripper comprises at least one of an ammonia, an alcohol, and an ester compound.

2. The method according to claim 1, wherein, in the step of etching to remove the exposed portion of the third metal layer and the second metal layer corresponding to and below the exposed portion of the third metal layer comprises:
    using wet etching method to etch the exposed portion of the third metal layer and the second metal layer corresponding to and below the exposed portion of the third metal layer.

3. The method according to claim 1, wherein, in the step of etching the exposed portion of the ohmic contact layer comprises:
    using dry etching method to etch the exposed portion of the ohmic contact layer.

4. The method according to claim 1, wherein, in the step of forming sequentially a first metal layer, an insulating layer, a semiconductor layer, an ohmic contact layer, a second metal layer, a third metal layer and a photoresist layer on a base substrate comprises:
    forming the first metal layer on the base substrate, performing etching to the first metal layer to form the control electrode of the switch;
    after etching the first metal layer, forming the insulating layer on the first metal;
    sequentially forming the semiconductor layer and the ohmic contact layer, and patterning the semiconductor layer and the ohmic contact layer; and
    sequentially forming the second metal layer, the third metal layer and the photoresist layer on the ohmic contact layer.

5. The method according to claim 1, wherein, the switch is a thin film transistor, and the first metal layer is used for forming a gate electrode as the control electrode of the thin film transistor, and the third metal layer is used for forming a source electrode as the input electrode of the thin film transistor and a drain as the output electrode.

6. A method for manufacturing a switch of an array substrate, comprising:
  forming sequentially a first metal layer, an insulating layer, a semiconductor layer, an ohmic contact layer, a second metal layer, a third metal layer and a photoresist layer on a base substrate, wherein, the first metal layer uses for forming a control electrode of a switch, and the third metal layer uses for forming an input electrode and an output electrode of the switch;
  patterning the photoresist layer to expose a portion of the third metal layer;
  etching to remove the exposed portion of the third metal layer and the second metal layer corresponding to and below the exposed portion of the third metal layer to form the input electrode and the output electrode of the switch, and to expose a portion of the ohmic contact layer;
  making a contact to the base substrate with a stripper comprising at least 30% by weight of amine to remove the photoresist layer and a residual second metal layer corresponding to and below the exposed portion of the third metal layer; and
  etching the exposed portion of the ohmic contact layer;
  wherein, the second metal layer comprises molybdenum metal or titanium metal, and its thickness ranges from 150 A to 300 A, and the third metal layer comprises copper, and its thickness ranges from 1500 A to 5000 A.

7. The method according to claim 6, wherein, in the step of etching to remove the exposed portion of the third metal layer and the second metal layer corresponding to and below the exposed portion of the third metal layer comprises:
  using wet etching method to etch the exposed portion of the third metal layer and the second metal layer corresponding to and below the exposed portion of the third metal layer.

8. The method according to claim 6, wherein, in the step of etching the exposed portion of the ohmic contact layer comprises:
  using dry etching method to etch the exposed portion of the ohmic contact layer.

9. The method according to claim 6, wherein, in the step of forming sequentially a first metal layer, an insulating layer, a semiconductor layer, an ohmic contact layer, a second metal layer, a third metal layer and a photoresist layer on a base substrate comprises:
  forming the first metal layer on the base substrate, performing etching to the first metal layer to form the control electrode of the switch;
  after etching the first metal layer, forming the insulating layer on the first metal;
  sequentially forming the semiconductor layer and the ohmic contact layer, and patterning the semiconductor layer and the ohmic contact layer; and
  sequentially forming the second metal layer, the third metal layer and the photoresist layer on the ohmic contact layer.

10. The method according to claim 6, wherein, the switch is a thin film transistor, and the first metal layer is used for forming a gate electrode as the control electrode of the thin film transistor, and the third metal layer is used for forming a source electrode as the input electrode of the thin film transistor and a drain as the output electrode.

11. A manufacturing method for an array substrate comprising a manufacturing method for a switch, the method comprising:
  forming sequentially a first metal layer, an insulating layer, a semiconductor layer, an ohmic contact layer, a second metal layer, a third metal layer and a photoresist layer on a base substrate, wherein, the first metal layer uses for forming a control electrode of a switch, and the third metal layer uses for forming an input electrode and an output electrode of the switch;
  patterning the photoresist layer to expose a portion of the third metal layer;
  etching to remove the exposed portion of the third metal layer and the second metal layer corresponding to and below the exposed portion of the third metal layer to form the input electrode and the output electrode of the switch, and to expose a portion of the ohmic contact layer;
  making a contact to the base substrate with a stripper comprising at least 30% by weight of amine in order to remove the photoresist layer and a residual second metal layer corresponding to and below the exposed portion of the third metal layer; and
  etching the exposed portion of the ohmic contact layer;
  wherein, the second metal layer comprises molybdenum metal or titanium metal, and its thickness ranges from 150 A to 300 A, and the third metal layer comprises copper, and its thickness ranges from 1500 A to 5000 A.

12. The method according to claim 11, wherein, the stripper comprises at least one of ammonia, an alcohol, and an ester compound.

13. The method according to claim 11, wherein, in the step of etching to remove the exposed portion of the third metal layer and the second metal layer corresponding to and below the exposed portion of the third metal layer comprises:
  using wet etching method to etch the exposed portion of the third metal layer and the second metal layer corresponding to and below the exposed portion of the third metal layer.

14. The method according to claim 11, wherein, in the step of etching the exposed portion of the ohmic contact layer comprises:
  using dry etching method to etch the exposed portion of the ohmic contact layer.

15. The method according to claim 11, wherein, in the step of forming sequentially a first metal layer, an insulating layer, a semiconductor layer, an ohmic contact layer, a second metal layer, a third metal layer and a photoresist layer on a base substrate comprises:
  forming the first metal layer on the base substrate, performing etching to the first metal layer to form the control electrode of the switch;
  after etching the first metal layer, forming the insulating layer on the first metal;
  sequentially forming the semiconductor layer and the ohmic contact layer, and patterning the semiconductor layer and the ohmic contact layer; and
  sequentially forming the second metal layer, the third metal layer and the photoresist layer on the ohmic contact layer.

16. The method according to claim 11, wherein, the switch is a thin film transistor, and the first metal layer is used for forming a gate electrode as the control electrode of the thin film transistor, and the third metal layer is used for forming a source electrode as the input electrode of the thin film transistor and a drain as the output electrode.

* * * * *